(12) United States Patent
Sakuma et al.

(10) Patent No.: US 9,661,783 B2
(45) Date of Patent: *May 23, 2017

(54) MAGNETIC COMPONENT COOLING STRUCTURE AND POWER CONVERTER HAVING THE SAME

(71) Applicant: FUJI ELECTRIC CO., LTD., Kawasaki-shi (JP)

(72) Inventors: Masaki Sakuma, Hino (JP); Masakazu Gekinozu, Matsumoto (JP); Yukihiro Nishikawa, Kodaira (JP); Yasuhito Tanaka, Yokosuka (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 94 days.

This patent is subject to a terminal disclaimer.

(21) Appl. No.: 14/680,053

(22) Filed: Apr. 6, 2015

(65) Prior Publication Data

US 2015/0245537 A1    Aug. 27, 2015

Related U.S. Application Data

(63) Continuation of application No. PCT/JP2014/000921, filed on Feb. 21, 2014.

(30) Foreign Application Priority Data

Mar. 19, 2013  (JP) ................. 2013-056928

(51) Int. Cl.
*H01H 47/00* (2006.01)
*H05K 7/20* (2006.01)
*H01F 27/08* (2006.01)

(52) U.S. Cl.
CPC ....... *H05K 7/20145* (2013.01); *H01F 27/085* (2013.01); *H05K 7/202* (2013.01); *H05K 7/2039* (2013.01); *H05K 7/20909* (2013.01)

(58) Field of Classification Search
CPC .................................................. H05K 7/20145
(Continued)

(56) References Cited

U.S. PATENT DOCUMENTS 4,027,205 A * 5/1977 Frederick ........... H05K 7/20145
174/16.1
6,144,556 A * 11/2000 Lanclos ............. H05K 7/20854
361/695

(Continued)

FOREIGN PATENT DOCUMENTS

CN      1512108 A    7/2004
JP      S5931798 U   2/1984

(Continued)

OTHER PUBLICATIONS

Japanese Office Action with partial translation dated Mar. 15, 2016.

*Primary Examiner* — Stephen W Jackson
(74) *Attorney, Agent, or Firm* — Rabin & Berdo, P.C.

(57) ABSTRACT

Provided is a cool air flow space in which cool air, that is generated by an inner fan disposed inside a housing, flows in the housing. An attachment member mounts a magnetic component on a bottom portion of the housing at a position within the cool air flow space. The attachment member includes a top plate and a pair of legs that extends downward from the top plate and that is fixed to the bottom portion.

19 Claims, 11 Drawing Sheets

(58) Field of Classification Search
USPC .......................................................... 361/142
See application file for complete search history.

(56) References Cited

U.S. PATENT DOCUMENTS

| | | | | |
|---|---|---|---|---|
| 6,822,856 | B2* | 11/2004 | Fujiwara | G06F 1/203 |
| | | | | 165/185 |
| 6,903,910 | B1* | 6/2005 | Griesing | G01R 29/0821 |
| | | | | 361/142 |
| 7,813,128 | B2* | 10/2010 | Marchand | H05K 7/20909 |
| | | | | 361/694 |
| 8,320,127 | B2* | 11/2012 | Leutwein | H05K 7/20909 |
| | | | | 165/185 |
| 8,741,466 | B2* | 6/2014 | Youngs | B60K 6/28 |
| | | | | 165/80.3 |
| 2004/0149752 | A1 | 8/2004 | Yamaguchi et al. | |
| 2005/0092743 | A1 | 5/2005 | Lee | |

FOREIGN PATENT DOCUMENTS

| | | |
|---|---|---|
| JP | S59-198693 A | 11/1984 |
| JP | S6090817 U | 6/1985 |
| JP | S61-86916 U | 6/1986 |
| JP | S61-167398 U | 10/1986 |
| JP | S62-2221 U | 1/1987 |
| JP | H2-17814 U | 2/1990 |
| JP | H2-33418 U | 3/1990 |
| JP | H4-12618 U | 1/1992 |
| JP | H09-213532 A | 8/1997 |
| JP | 2001-143938 | 5/2001 |
| JP | 2001-237122 | 8/2001 |

* cited by examiner

MAGNETIC COMPONENT COOLING STRUCTURE AND POWER CONVERTER HAVING THE SAME

CROSS-REFERENCE TO RELATED APPLICATIONS

This application is a continuation under 35 U.S.C. 120 of International Application PCT/JP2014/000921 having the International Filing Date of Feb. 21, 2014, and having the benefit of the earlier filing date of Japanese Application No. 2013-056928, filed Mar. 19, 2013. All of the identified applications are fully incorporated herein by reference.

TECHNICAL FIELD

The present invention relates to a structure of cooling magnetic components incorporated in a housing and a power converter having the same.

BACKGROUND ART

In a power converter such as an AC/DC converter, conventionally magnetic component such as a transformer are incorporated in a housing and the magnetic components are fixed at the bottom of the housing. When magnetic components are incorporated in a housing, it is necessary to cool the magnetic components efficiently since the magnetic components are heat generating bodies.

Patent Document 1 discloses an example of a conventional structure for cooling a transformer.

In a conventional structure of cooling a transformer disclosed in Patent Document 1, a ventilation hole is formed in a portion of a magnet core of the transformer on which a coil is wound, and a fan is provided on the outer side of the transformer at one end of the ventilation hole. Moreover, this fan is driven to draw or blow air from or toward the ventilation hole so that the transformer is directly cooled down.

Patent Document 1: Japanese Patent Application Publication No. 2001-237122

DISCLOSURE OF THE INVENTION

However, since the structure disclosed in Patent Document 1 requires a fan dedicated for cooling the transformer, the cost of manufacturing the structure may increase.

Moreover, since the transformer in which a fan is provided on the outer side becomes a large component, the transformer may cause a problem in a layout space for another component when the transformer is disposed in the housing.

The present invention has been made in view of the problem and an object thereof is to provide a small and inexpensive cooling structure for magnetic components, which can improve cooling efficiency of magnetic components and does not cause any problem in the layout space of another component and a power converter having the same.

In order to attain the object, an aspect of the present invention provides a magnetic component cooling structure for cooling a magnetic component incorporated in a housing, wherein a cool air flow space, in which cool air generated by an inner fan disposed inside the housing flows in the housing, is provided, the magnetic component mounted on a bottom portion of the housing is fixed to a position of the cool air flow space, to which the cool air is blown from the inner fan, by an attachment member, and the attachment member is a metal plate including: a top plate that makes contact with an upper surface of the magnetic component; a pair of legs that extends downward from the top plate and that is fixed to the bottom portion; and a guiding plate that guides the cool air blown from the inner fan into the magnetic component.

According to the magnetic component cooling structure according to this aspect, since the cool air of the inner fan is guided by the guiding plate of the attachment member so as to come in contact with the coils in the magnetic component, heat generated by the coils are radiate and the cooling efficiency of the magnetic component can be enhanced.

In the magnetic component cooling structure according to an aspect of the present invention, the guiding plate includes an upper guide plate that extends from the top plate toward the inner fan; and a side guide plate that extends from the legs toward the inner fan.

According to the magnetic component cooling structure according to this aspect, since the attachment member has a simple structure formed of a metal plate including the upper guide plate and the side guide plate, it is possible to reduce the cost of manufacturing the structure.

Another aspect of the present invention provides a magnetic component cooling structure for cooling a magnetic component incorporated in a housing, wherein a cool air flow space, in which cool air generated by an inner fan disposed inside the housing flows in the housing is provided, the magnetic component mounted on a bottom portion of the housing is fixed to a position of the cool air flow space, to which the cool air is blown from the inner fan, by an attachment member, and the attachment member is a metal member including: a top plate that makes contact with an upper surface of the magnetic component; a pair of legs that extends downward from the top plate and that is fixed to the bottom portion; and heatsinks that protrude outward from the pair of legs and makes contact with the cool air blown from the inner fan.

According to the magnetic component cooling structure according to this aspect, since the cool air of the inner fan comes in contact with the heatsinks provided in the pair of legs, heat is transmitted from the attachment member and the magnetic component is radiated. Moreover, since the cool air of the inner fan comes in contact with the coils in the magnetic component, the heat generated by the coils is radiated and the cooling efficiency of the magnetic component can be enhanced.

In the magnetic component cooling structure according to an aspect of the present invention, the bottom portion of the housing on which the magnetic component is mounted is a cooling body.

According to the magnetic component cooling structure according to this aspect, since the heat generated by the magnetic component is transmitted directly from the attachment member to the bottom portion of the housing, which is a cooling body, the cooling efficiency of the magnetic component is enhanced further.

Another aspect of the present invention provides a power converter which includes the magnetic component cooling structure and which converts AC power into DC power.

According to the power converter according to this aspect, it is possible to provide a small and inexpensive power converter capable of improving the cooling efficiency of the magnetic component.

According to the magnetic component cooling structure and the power converter having the same according to the present invention, since the cool air of the inner fan comes in contact with the coils in the magnetic component, the heat generated by the coils is radiated and the cooling efficiency of the magnetic component can be enhanced. Moreover, since the attachment member has a simple structure formed of a metal plate, it is possible to reduce the cost of manufacturing the structure.

BRIEF DESCRIPTION OF THE DRAWINGS

FIG. 7A is a perspective view illustrating constituent members of the transformer and FIG. 7B is a cross-sectional view of an assembled transformer.

FIG. 8A is a front view, FIG. 8B is a side view, and FIG. 8C is a cross-sectional view along line C-C of FIG. 8A.

BEST MODE FOR CARRYING OUT THE INVENTION

Figure 1:
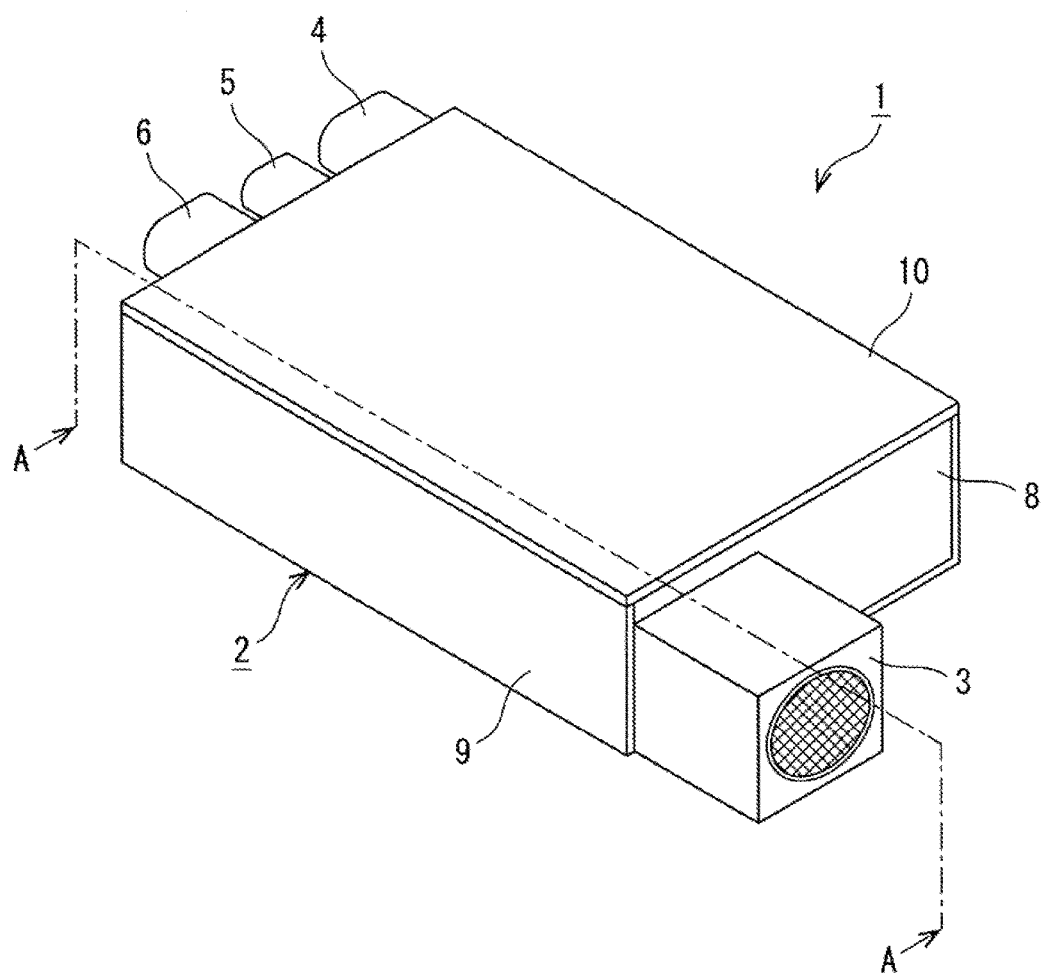
FIG. 1 is a perspective view illustrating an external view of a first embodiment of a power converter having a cooling structure for magnetic components according to an aspect of the present invention.

Hereinafter, an embodiment of a power converter having a cooling structure for magnetic components according to an aspect of the present invention will be described referring to the drawings as necessary.

FIG. 1 illustrates a power converter 1 according to a first embodiment used as an AC/DC converter. A blower fan 3 is externally attached to one side surface in a longitudinal direction of a rectangular parallelepiped housing 2. Moreover, an input connector 4, a control connector 5, and an output connector 6 are provided in parallel on the other side surface in the longitudinal direction of the housing 2. A power conversion control unit described later is incorporated in the housing 2. When a control signal is input to the control connector 5, commercial power input to the input connector 4 is converted from AC to DC by the power conversion control unit and is output as DC power from the output connector 6.

The rectangular parallelepiped housing 2 includes a casing 7, a chamber forming wall 8, a housing cover 9, and a lid 10.

Figure 5:
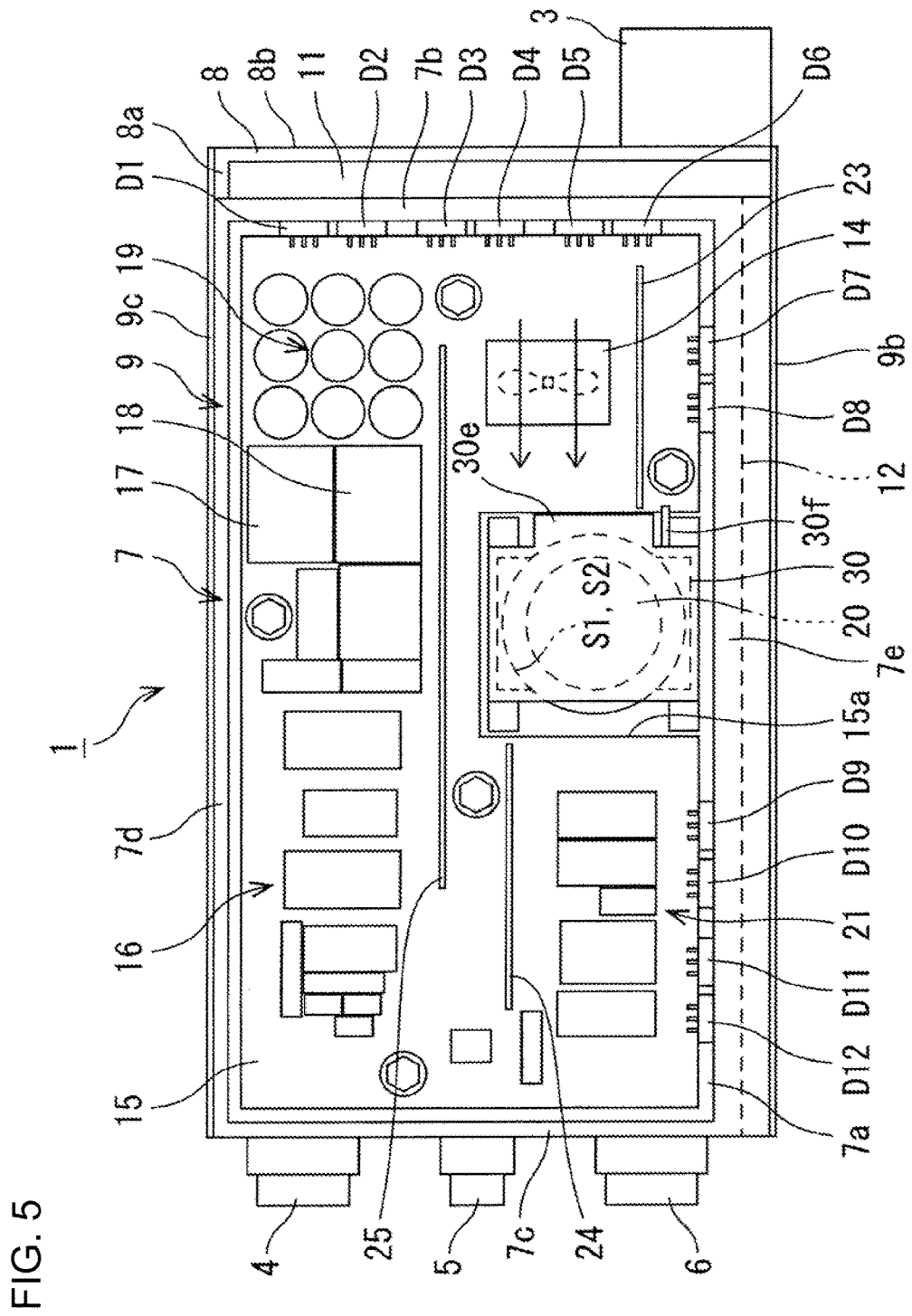
FIG. 5 is a plan view illustrating a state where a lid of a power converter according to a first embodiment is removed to show the interior of the converter.

The casing 7 has a bottomed box shape, which is rectangular in a plan view, and as illustrated in FIG. 5, includes a rectangular bottom portion 7a and a pair of short-side side wall 7b and 7c and a pair of long-side side walls 7d and 7e erected from four sides of the bottom portion 7a. The casing 7 is formed by die-casting aluminum or an aluminum alloy having high heat conductivity, for example.

The chamber forming wall 8 is disposed on one side in the longitudinal direction of the casing 7 and includes a contacting wall 8a that makes contact with one short-side side wall 7b of the casing 7 and a facing wall 8b that faces the short-side side wall 7b of the casing 7.

The housing cover 9 is formed so as to cover a portion of the casing 7 and the chamber forming wall 8. The lid 10 is provided so as to block an upper opening of the casing 7 and the chamber forming wall 8 to seal the inside of the housing 2.

Figure 3:
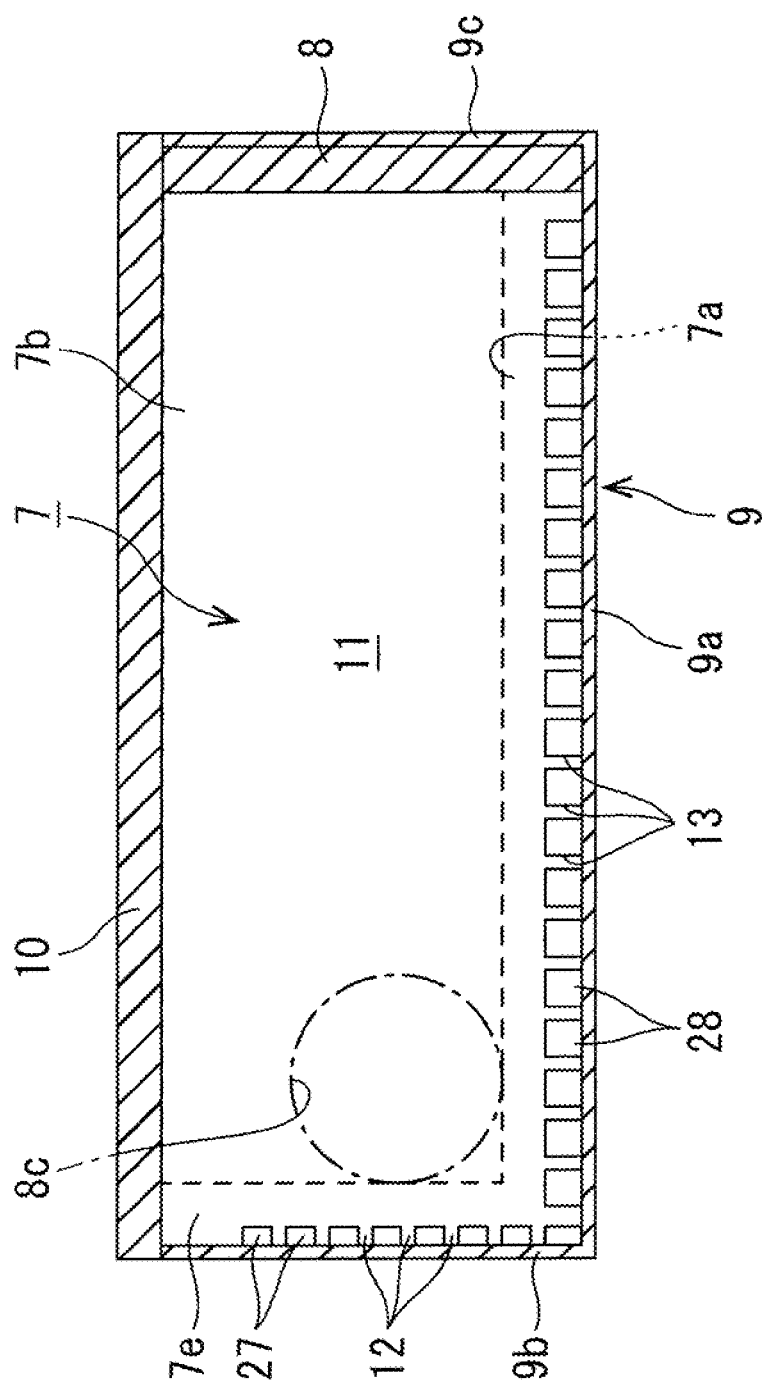
FIG. 3 is a cross-sectional view along line B-B of FIG. 2.
Figure 4:
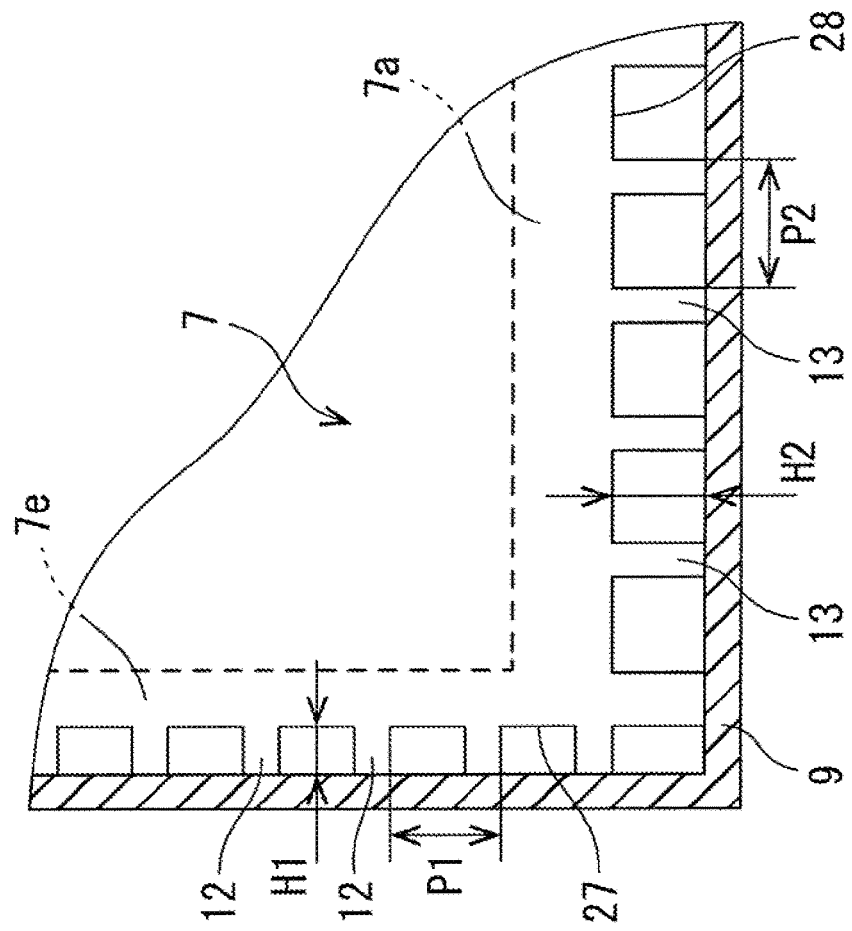
FIG. 4 is an enlarged view of a main part of FIG. 3.

As illustrated in FIG. 3, a plurality of side wall fins 12 extending in the longitudinal direction is formed on a region on the outer side of one long-side side wall 7e of the casing 7, with these fins extending from a lower end to an upper portion on the outer side of one long-side side wall 7e. The plurality of side wall fins 12 is formed in parallel at predetermined intervals in a vertical direction of the long-side side wall 7e. As illustrated in FIG. 4, a fin height of each side wall fin 12 is set to H1 and the pitch of the side wall fins 12 is set to P1. As illustrated in FIG. 5, no side wall fin is formed on the outer side of the other long-side side wall 7d of the casing 7.

Moreover, as illustrated in FIG. 3, a plurality of bottom fins 13 extending in the longitudinal direction is also formed on a region of a lower surface of the bottom portion 7a of the casing 7, with these fins extending from a lower end to the right side of the lower surface of the bottom portion 7a. The plurality of bottom fins 13 is formed in parallel at predetermined intervals in a lateral direction of the bottom portion 7a. As illustrated in FIG. 4, a fin height of each bottom fin 13 is set to H2 (H2>H1), which is larger than the fin height H1 of the side wall fin 12. Further, the pitch of the bottom fins 13 is set to P2 (P2>P1), which is larger than the pitch P1 of the side wall fins 12.

The housing cover 9 is a cover member that covers the side wall fins 12 and the bottom fins 13 from the outer side. As illustrated in FIGS. 3 and 5, the housing cover 9 includes a rectangular bottom plate 9a that covers a lower opening of the chamber forming wall 8 and the bottom portion 7a of the casing 7 and a pair of side plates 9b and 9c that is erected from the edges of the bottom plate 9a so as to cover the lateral portions of the chamber forming wall 8 and the pair of long-side side walls 7d and 7e of the casing 7.

As illustrated in FIG. 3, the spaces between the plurality of side wall fins 12 and the spaces between the plurality of bottom fins 13 on the outer circumferences of the other long-side side wall 7e and the bottom portion 7a of the casing 7 covered with the housing cover 9 form a plurality of flow channels 27 and 28 extending in the longitudinal direction of the casing 7. Moreover, the lid 10 is fixed to the casing 7 and the chamber forming wall 8 so as to block the upper opening of the chamber forming wall 8 and the casing 7. In this manner, a space on the inner side surrounded by one short-side side wall 7b of the casing 7, the chamber forming wall 8, the housing cover 9, and the lid 10 is defined as a chamber 11 which is a wind tunnel.

One set of ends in the longitudinal direction of the plurality of flow channels 27 and 28 formed between the housing cover 9 and the outer circumferences of the long-side side wall 7e and the bottom portion 7a of the casing 7 communicates with the chamber 11 and the other set of ends of the flow channels 27 and 28 communicates with the atmosphere. An opening 8c serving as an air inlet port is formed in the facing wall 8b of the chamber forming wall 8. The blower fan 3 is attached such that a ventilation port of the blower fan 3 faces the position of the opening 8c, and cool air generated by the blower fan 3 is blown into the chamber 11.

The power conversion control unit and an inner fan 14 are accommodated in the casing 7.

Figure 6:
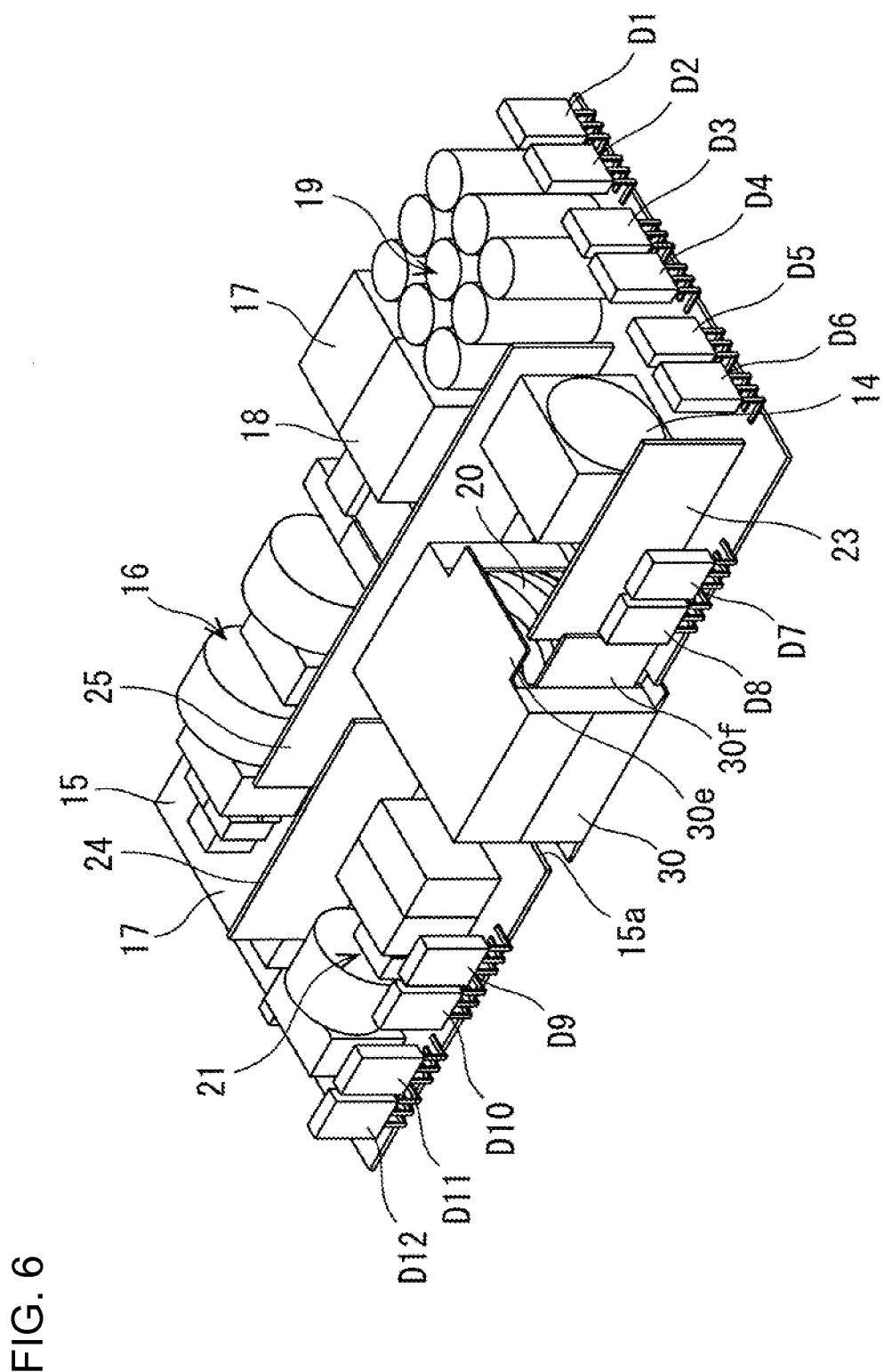
FIG. 6 is a perspective view illustrating control components of the power converter according to the first embodiment.

As illustrated in FIGS. 5 and 6, the power conversion control unit includes control components including a base substrate 15, an input-side noise filter unit 16, a first reactor 17, a second reactor 18, an electrolytic capacitor group 19, the transformer 20, an output-side noise filter unit 21, a plurality of semiconductor devices (for example, MOSFETs) D1 to D12, and first to third circuit boards 23 to 25.

The base substrate 15 is a member which has a rectangular shape that is smaller than a planar shape of the bottom portion 7a of the casing 7 and in which a notch 15a is formed on one long side. A predetermined wiring pattern (not illustrated) connected to the input connector 4, the control connector 5, and the output connector 6 is formed in the base substrate 15. The base substrate 15 is fixed by bolts to a support 26 formed on the upper surface of the bottom portion 7a of the casing 7 in a state where the notch 15a faces one long-side side wall 7e of the casing 7 (see FIG. 2).

The input-side noise filter unit 16, the first reactor 17, the second reactor 18, the electrolytic capacitor group 19, the output-side noise filter unit 21, the semiconductor device D1 to D12, and the first to third circuit boards 23 to 25 are mounted on the base substrate 15, and the inner fan 14 is also disposed on the base substrate 15.

Figure 2:
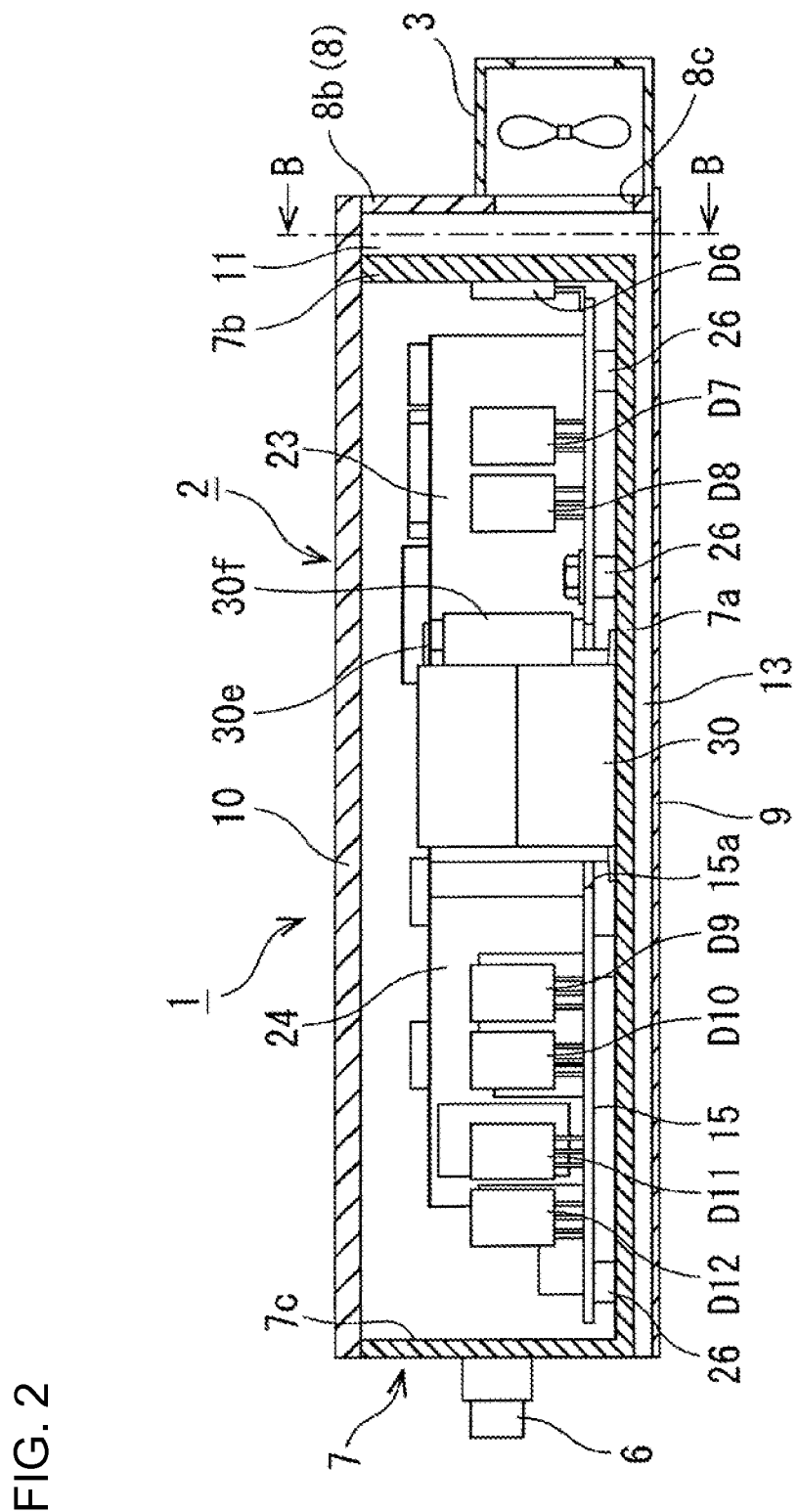
FIG. 2 is a cross-sectional view along line A-A of FIG. 1.

Moreover, as illustrated in FIGS. 2 and 5, the transformer 20 is disposed on the inner side of the notch 15a of the base substrate 15, and the transformer 20 is fixed directly to the bottom portion 7a of the casing 7 by the attachment member 30.

Figure 7A:
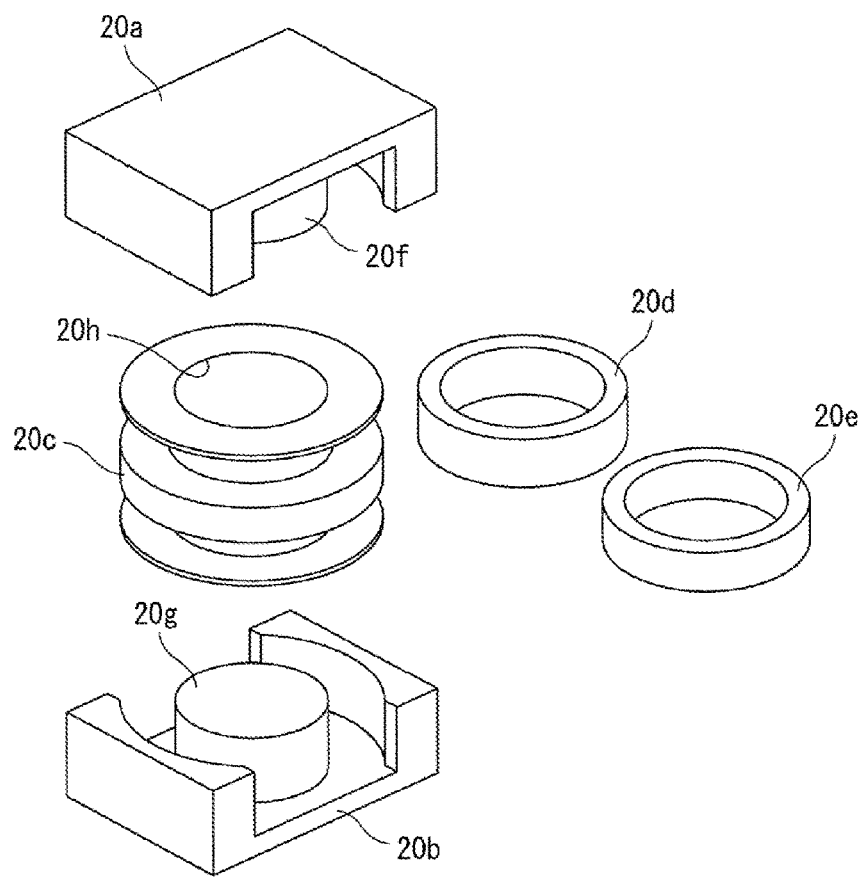
FIGS. 7A and 7B are diagrams illustrating a configuration of a transformer incorporated in a housing of the power converter according to the first embodiment, where
Figure 7B:
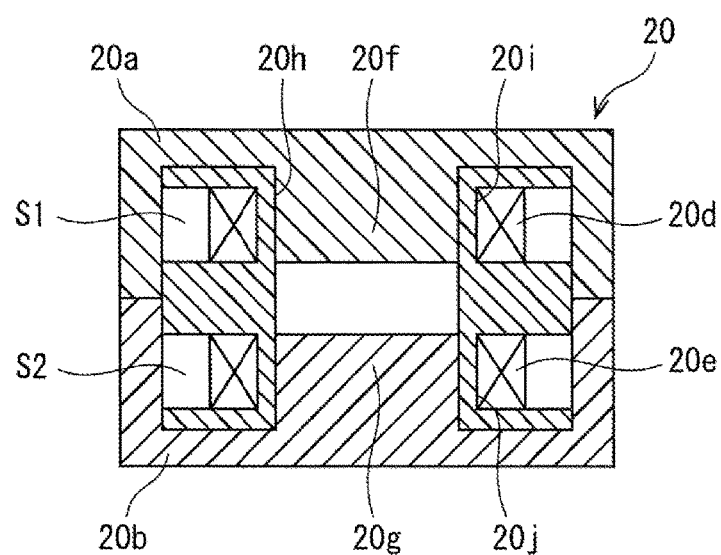

As illustrated in FIG. 7A, the transformer 20 includes an upper core 20a, a lower core 20b, an approximately cylindrical bobbin 20c, a primary coil 20d, and a secondary coil 20e. As illustrated in FIG. 7B, a convex portion 20f provided on the upper core 20a and a convex portion 20g provided on the lower core 20b engage with an engagement hole 20h formed along the axis of the bobbin 20c from the upper and lower sides. The primary coil 20d is wound around an upper core accommodation concave portion 20i formed in an upper portion of the bobbin 20c, and the secondary coil 20e is wound around a lower core accommodation concave portion 20j formed in a lower portion of the bobbin 20c, whereby the transformer 20 is formed.

Figure 8A:
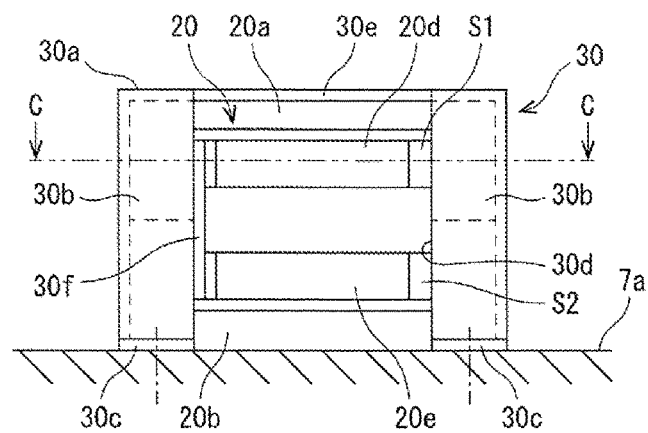
FIGS. 8A to 8C illustrate a state where the transformer of the power converter according to the first embodiment is fixed to a housing by an attachment member, where

As illustrated in FIG. 8A, the attachment member 30 is a metal plate that includes a rectangular top plate 30a that makes contact with an upper surface of the upper core 20a of the transformer 20, a pair of legs 30b that extends downward in parallel from edges of two facing sides of the top plate 30a, and a fixing portion 30c that extends in an orthogonal direction from the lower ends of the pair of legs 30b.

Figure 8B:
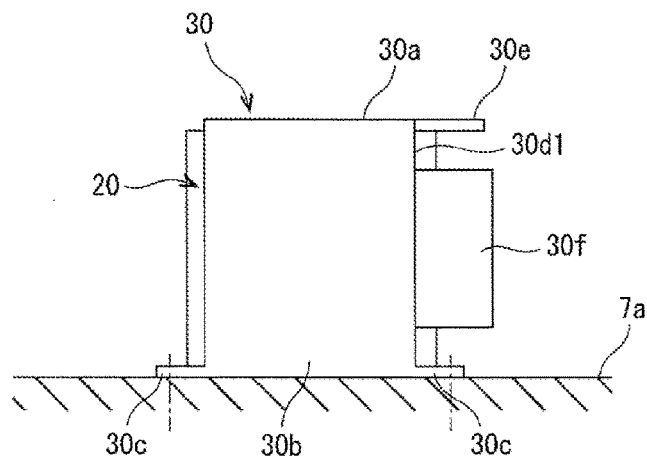

As illustrated in FIG. 8B, in the attachment member 30, an upper guide plate 30e that protrudes toward a front side of one opening 30d1 along a planar direction of the top plate 30a is formed above the opening 30d1 between the pair of legs 30b, and a side guide plate 30f that protrudes toward the opening 30d1 is formed on a side portion of one leg 30b that forms the opening 30d1.

Figure 8C:
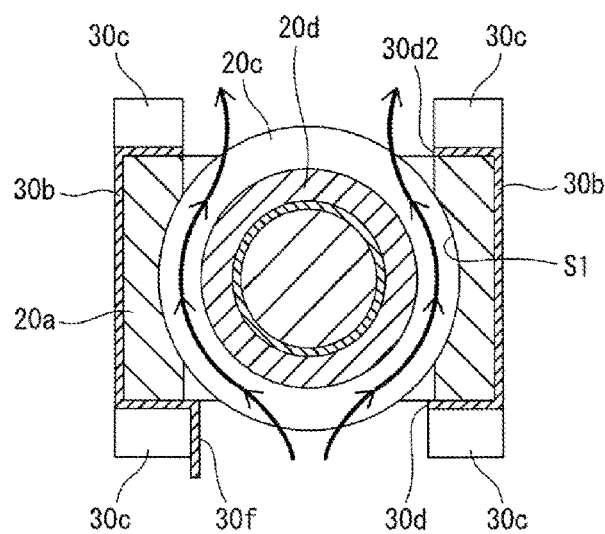

Here, as illustrated in FIGS. 8A and 8C, a gap S1 is formed between the inner surface of the upper core 20a and the primary coil 20d wound around the upper core accommodation concave portion 20i, and this gap S1 forms an intra-transformer flow space (hereinafter referred to as an intra-transformer flow space S1) in which cool air flows from one opening 30d1 (which may be referred to as a first opening) to the other opening 30d2 (which may be referred to as a second opening). Moreover, a gap S2 is also formed between the inner surface of the lower core 20b and the secondary coil 20e wound around the lower core accommodation concave portion 20j, and this gap S2 forms an intra-transformer flow space (hereinafter referred to as an intra-transformer flow space S2) in which cool air flows from one opening 30d1 to the other opening 30d2.

A specific layout of the control components and the inner fan 14 will be described with reference to FIG. 5.

The semiconductor devices D1 to D6 are mounted at predetermined intervals in parallel along one short side of the base substrate 15. The semiconductor devices D1 to D6 are positioned so that the semiconductor devices make direct contact with one short-side side wall 7b of the casing 7, defining the chamber 11. Other semiconductor devices D7 and D12 are mounted at predetermined intervals in parallel along one long side of the base substrate 15. The semiconductor devices D7 to D12 are positioned so that the semiconductor devices make direct contact with one long-side side wall 7e of the casing 7, forming the side wall fins 12.

Moreover, the third circuit board 25 is mounted at a central position in the lateral direction of the base substrate 15 so as to be erected while extending in the longitudinal direction. The second circuit board 24 is mounted on the base substrate 15 at a position close to the other short-side side wall 7c of the casing 7 so as to be erected in parallel to the third circuit board 25 while extending in the longitudinal direction.

Moreover, the input-side noise filter unit 16, the first reactor 17, the second reactor 18, and the electrolytic capacitor group 19 are mounted on the base substrate 15 so as to be positioned between the third circuit board 25 and the other long-side side wall 7d of the casing 7. Moreover, the output-side noise filter unit 21 is mounted on the base substrate 15 so as to be positioned between the second circuit board 24 and one long-side side wall 7e of the casing 7.

The inner fan 14 is disposed on the base substrate 15 at a position close to a position at which one long-side side wall 7e and one short-side side wall 7bo f the casing 7 cross each other so that the direction of blowing cool air faces the other short-side side wall 7c of the casing 7.

The first circuit board 23 is mounted between the inner fan 14 and one long-side side wall 7e so as to be erected while extending in the longitudinal direction of the base substrate 15.

The transformer 20 is disposed on the inner side of the notch 15a of the base substrate 15, which is the position to which the cool air from the inner fan 14 is blown, and is directly fixed to the bottom portion 7a as the fixing portion 30c of the attachment member 30 is connected to the bottom portion 7a of the casing 7 by a fixing screw (not illustrated).

Here, the upper guide plate 30e of the attachment member 30 is disposed so as to extend toward the inner fan 14. Moreover, the side guide plate 30f of the attachment member 30 is disposed between the inner fan 14 and one long-side side wall 7e so as to extend approximately in parallel to the first circuit board 23 so as to follow the first circuit board 23 which is mounted on the base substrate 15.

Next, the operation and the cooling effect of the power converter 1 will be described.

In the power converter 1 according to the present embodiment, when a control signal is input to the control connector 5, commercial power input to the input connector 4 is converted from AC to DC by the power conversion control unit accommodated in the casing 7 and is output as DC power from the output connector 6. In this case, the control components such as the transformer 20 and the power conversion control unit in the casing 7 generate heat, and in particular, the primary coil 20d and the secondary coil 20e of the transformer 20 generate a large amount of heat.

Figure 9:
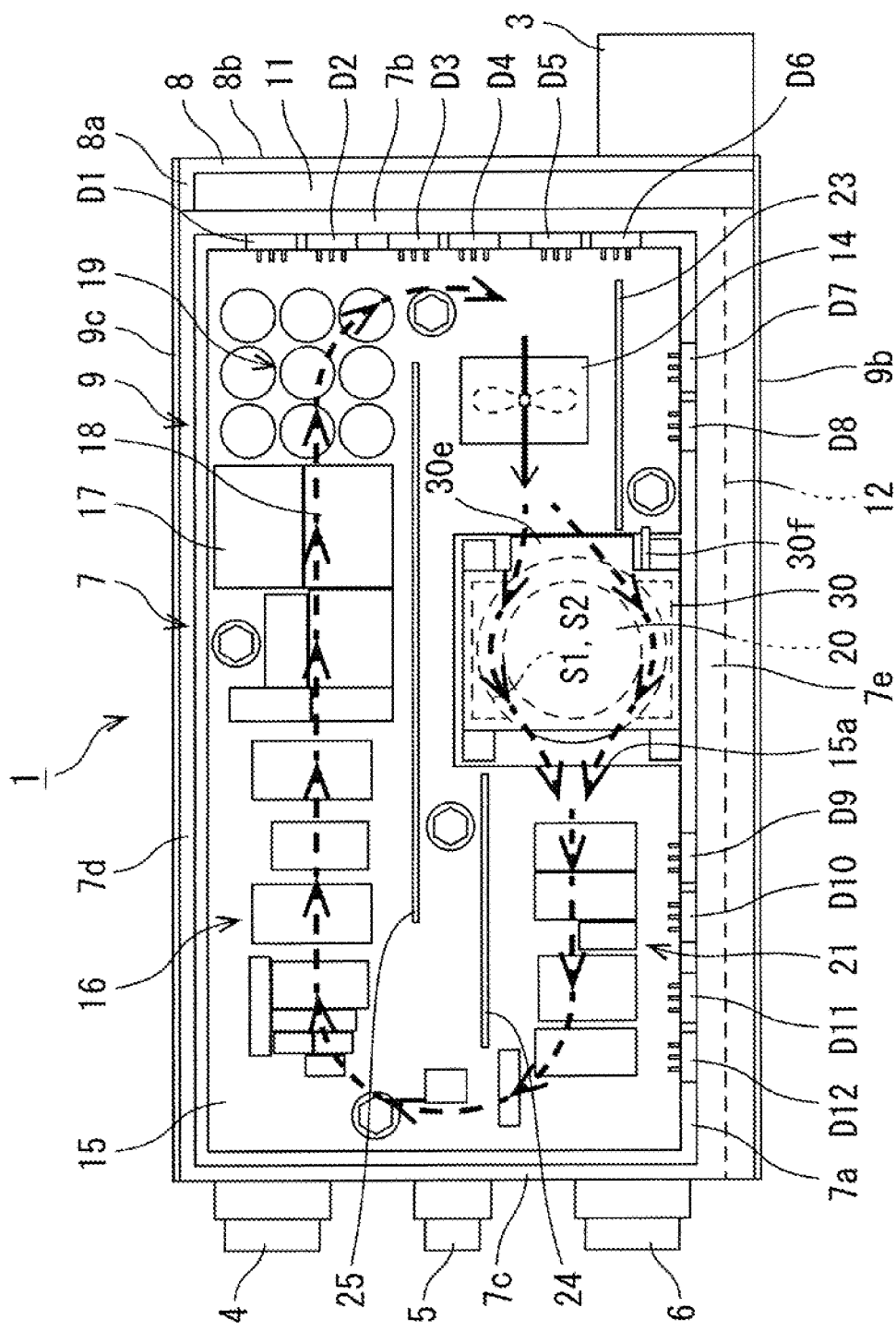
FIG. 9 is a diagram illustrating the flow of cool air in the casing, generated with driving of an inner fan according to the first embodiment.

When the inner fan 14 is driven, the third circuit board 25 and the second circuit board 24 erected and mounted at the central position in the lateral direction of the base substrate 15 function as a wind guiding plate, and a flow of cool air which circulate in the order of the transformer 20, the output-side noise filter unit 21, the input-side noise filter unit 16, the first reactor, the second reactor, and the electrolytic capacitor group 19 is generated as indicated by a broken-line arrow in FIG. 9.

Here, when the flow of cool air generated by the inner fan 14 flows through an upper space of the attachment member 30, the upper guide plate 30e provided in the attachment member 30 guides the flow of cool air toward the lower side and allow the cool air to flow through the intra-transformer flow spaces S1 and S2 of the transformer 20.

Moreover, when the flow of cool air generated by the inner fan 14 flows toward one long-side side wall 7e on the outer side of the attachment member 30, the first circuit board 23 disposed between the inner fan 14 and one long-side side wall 7e and the side guide plate 30f provided in the attachment member 30 guide the flow of cool air toward the inner side of the attachment member 30 to allow the cool air to flow through the intra-transformer flow spaces S1 and S2 of the transformer 20.

In this manner, since the cool air generated by the inner fan 14 is guided toward the inner side of the attachment member 30 and flows into the intra-transformer flow spaces S1 and S2 of the transformer 20, the heat generated by the primary coil 20d and the secondary coil 20e of the transformer 20 is radiated.

Moreover, when the blower fan 3 is driven, the cool air drawn from the outside is blown into the chamber 11. Since the cool air blown into the chamber 11 enters into the plurality of flow channels 28 formed on the bottom portion 7a of the casing 7, communicating with the chamber 11, and is discharged outside, the bottom portion 7a serves as a cooling body. Moreover, since cool air also enters into the plurality of flow channels 27 formed on one long-side side wall 7e communicating with the chamber 11 and is discharged outside, the long-side side wall 7e also serves as a cooling body.

Since the transformer 20 is fixed so as to make direct contact with the bottom portion 7a of the casing 7, serving as a cooling body, the heat generated by the transformer 20 is transmitted directly from the attachment member 30 to the bottom portion 7a and is radiated.

A cool air flow space according to the present invention corresponds to the flow of cool air that circulates in the order of the transformer 20, the output-side noise filter unit 21, the input-side noise filter unit 16, the first reactor, the second reactor, and the electrolytic capacitor group 19.

Next, advantageous effects of the present invention will be described.

In the present embodiment, the upper guide plate 30e and the side guide plate 30f provided in the attachment member 30 that fixes the transformer 20 to the bottom portion 7a guide the flow of cool air generated by the inner fan 14 so as to flow into the intra-transformer flow spaces S1 and S2 of the transformer 20. Thus, the heat generated by the primary coil 20d and the secondary coil 20e of the transformer 20 is cooled by the cool air, and the cooling efficiency of the transformer 20 can be enhanced.

Moreover, since the transformer 20 is fixed so as to make direct contact with the bottom portion 7a of the casing 7 serving as a cooling body, the heat generated by the transformer 20 is transmitted directly from the attachment member 30 to the bottom portion 7a, and the cooling efficiency of the transformer 20 can be further enhanced.

Moreover, since the attachment member 30 according to the present embodiment has a simple structure made up of a metal plate including the upper guide plate 30e and the side guide plate 30f, it is possible to reduce the cost of manufacturing the structure.

Further, since the attachment member 30 including the upper guide plate 30e and the side guide plate 30f is a small component, it is possible to secure a sufficient layout space inside the casing 7.

Figure 10:
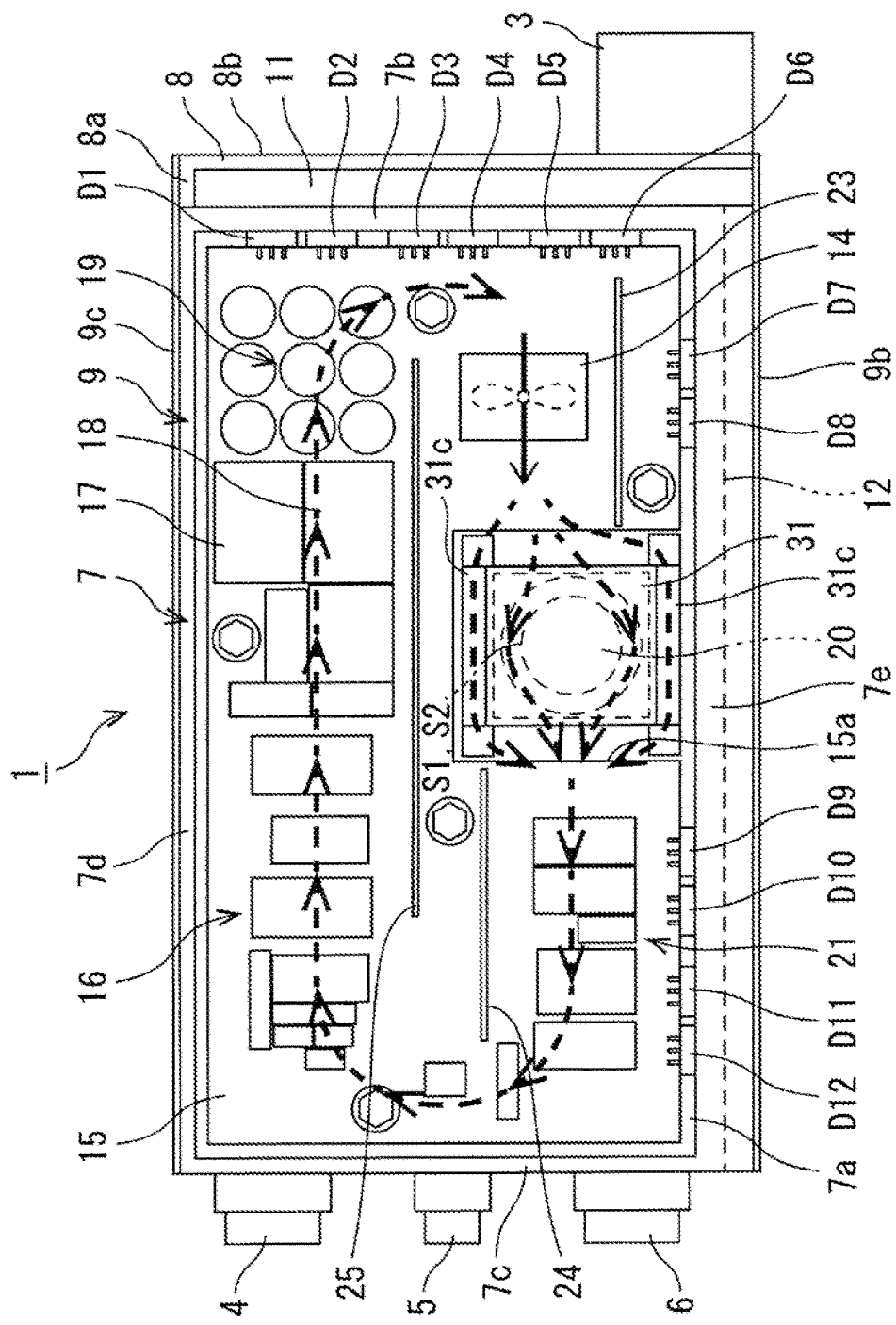
FIG. 10 is a diagram illustrating the flow of cool air in the casing, generated with driving of an inner fan according to a second embodiment of the present invention.
Figure 11:
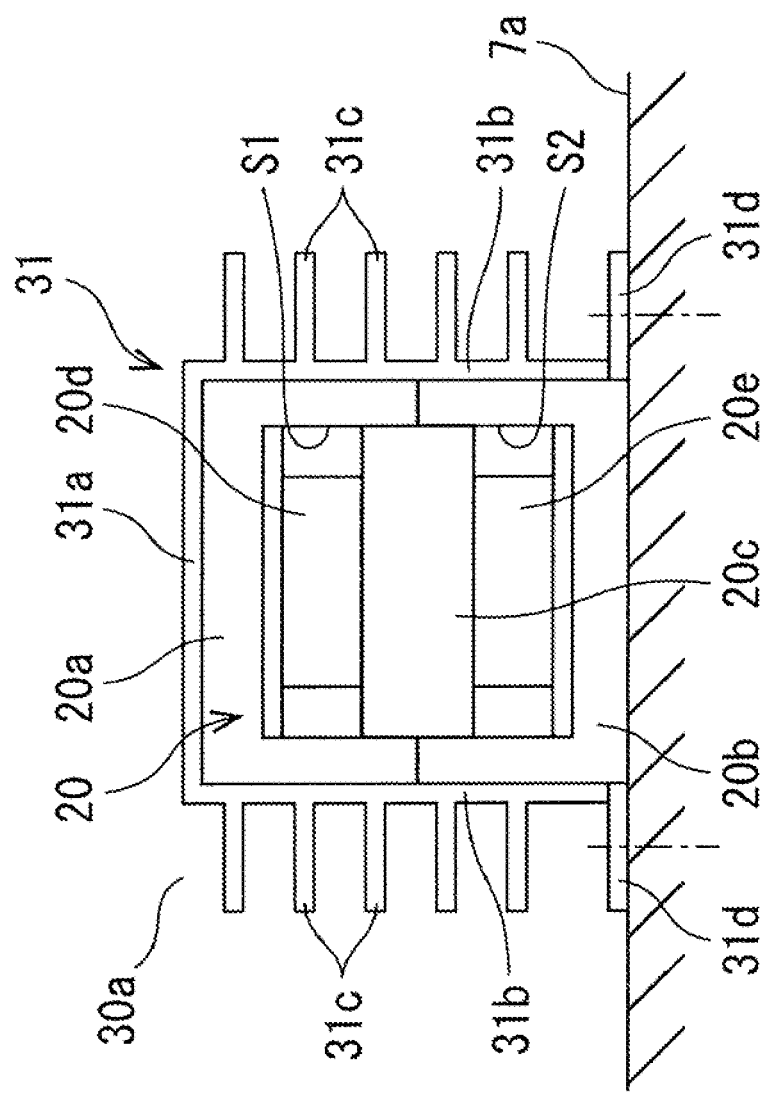
FIG. 11 is a diagram illustrating magnetic components incorporated in a housing of a power converter according to the second embodiment of the present invention.

FIGS. 10 and 11 illustrate a power converter 1 according to a second embodiment of the present invention. The same constituent portions as those illustrated in FIGS. 1 to 9 will be denoted by the same reference numerals and description thereof will not be provided.

In the present embodiment, as illustrated in FIG. 10, the transformer 20 disposed on the inner side of the notch 15a of the base substrate 15 is fixed directly to the bottom portion 7a of the casing 7 by an attachment member 31.

As illustrated in FIG. 11, the attachment member 31 includes a rectangular top plate 31a that makes contact with an upper surface of the transformer 20 (the upper core 20a), a pair of legs 31b that extends downward in parallel from edges of two facing sides of the top plate 31a, a plurality of strip-shaped heatsinks 31c that protrudes in parallel from the outer circumferences of the pair of legs 31b, and a fixing portion 31d that extends in an orthogonal from the lower ends of the pair of legs 31b.

In the transformer of the present embodiment, the intra-transformer flow space S1 is formed between the inner surface of the upper core 20a and the primary coil 20d wound around the upper core accommodation concave portion 20i, and the intra-transformer flow space S2 is formed between the inner surface of the lower core 20b and the secondary coil 20e wound around the lower core accommodation concave portion 20j.

The transformer 20 is disposed on the inner side of the notch 15a of the base substrate 15 and is fixed directly to the bottom portion 7a as the fixing portion 31d of the attachment member 31 is connected to the bottom portion 7a of the casing 7 by a fixing screw (not illustrated).

According to the present embodiment, with the attachment member 31 being provided with the plurality of heatsinks 31c on the outer side of the pair of legs 31b, a structure has been formed, which has an increased heat radiating area.

Although the heat generated by the transformer 20 is transmitted to the attachment member 31, since the cool air generated by the inner fan 14 comes into contact with the heatsinks 31c, the attachment member 31 is cooled down and the transformer 20 is cooled efficiently. Moreover, the cool air generated by the inner fan 14 flows through the intra-transformer flow spaces S1 and S2 of the transformer 20 to thereby cool down the primary coil 20d and the secondary coil 20e of the transformer 20.

Therefore, in the present embodiment, since the cool air generated by the inner fan 14 comes in contact with the plurality of heatsinks 31*c* formed on the outer side of the attachment member 31, the cooling efficiency of the transformer 20 can be enhanced sufficiently.

Moreover, since the cool air generated by the inner fan 14 flows through the intra-transformer flow spaces S1 and S2 of the transformer 20 to directly cool down the primary coil 20*d* and the secondary coil 20*e* of the transformer 20, the cooling efficiency is enhanced.

Moreover, since the transformer 20 is fixed so as to make direct contact with the bottom portion 7*a* of the casing 7, serving as a cooling body, the heat generated by the transformer 20 is transmitted directly from the attachment member 31 to the bottom portion 7*a*, and the cooling efficiency of the transformer 20 can be enhanced further.

Moreover, in the present embodiment, since a simple structure in which a plurality of heatsinks 31*c* is provided on the outer side of the attachment member 31 is adopted, it is possible to reduce the cost of manufacturing the structure.

Further, since the attachment member 31 including the plurality of heatsinks 31*c* is a small component, it is possible to secure a sufficient layout space inside the casing 7.

While embodiments of the present invention have been described, the present invention is not limited to these embodiments and various changes and improvements can be made. For example, the magnetic component is not limited to the transformer 20 but may be a reactor or the like if the magnetic component is an electronic component that generates heat.

Although the attachment member 30 having a pair of legs 30*b* and the attachment member 31 having a pair of legs 31*b* have been illustrated in the first and second embodiments, respectively, the leg may be divided further (for example, into two legs) so that a pair of legs includes four legs in total.

INDUSTRIAL APPLICABILITY

As described above, the cooling structure for magnetic components and the power converter having the same according to the present invention is useful to implement downsizing while improving the cooling efficiency of magnetic components without causing any problem in the layout space of another component.

EXPLANATION OF REFERENCE NUMERALS

1: Power converter
2: Housing
3: Blower fan
4: Input connector
5: Control connector
6: Output connector
7: Casing
7*a*: Bottom portion
7*b*: Short-side side wall
7*c*: Short-side side wall
7*d*: Long-side side wall
7*e*: Long-side side wall
8: Chamber forming wall
8*a*: Contacting wall
8*b*: Facing wall
8*c*: Opening
9: Housing cover
9*a*: Bottom plate
9*b*, 9*c*: Side plate
10: Lid
11: Chamber
12: Side wall fin
13: Bottom fin
14: Inner fan
15: Base substrate
15*a*: Notch
16: Input-side noise filter unit
17: First reactor
18: Second reactor
19: Electrolytic capacitor group
20: Transformer
20*a*: Upper core
20*b*: Lower core
20*c*: Bobbin
20*d*: Primary coil
20*e*: Secondary coil
20*f*: Convex portion
20*g*: Convex portion
20*h*: Engagement hole
20*i*: Upper coil accommodation concave portion
20*j*: Lower coil accommodation concave portion
21: Output-side noise filter unit
23: First circuit board
24: Second circuit board
25: Third circuit board
26: Support
27, 28: Flow channel
30, 31: Attachment member
30*a*, 31*a*: Top plate
30*b*, 31*b*: Leg
30*c*, 31*d*: Fixing portion
30*d*1: One of openings
30*d*2: The other one of openings
30*e*: Upper guide plate
30*f*: Side guide plate
31*c*: Heatsink
S1, S2: Intra-transformer flow space
D1 to D12: Semiconductor device

The invention claimed is:

1. A magnetic component cooling structure for cooling a magnetic component, the magnetic component cooling structure comprising:
a housing that the magnetic component is disposed within;
an inner fan disposed inside the housing to generate cool air that flows in the housing so that a cool air flow space, in which the cool air generated by the inner fan flows in the housing, is formed;
an attachment member mounting the magnetic component on a bottom portion of the housing so that the magnetic component is fixed to a position within the cool air flow space such that the cool air is blown from the inner fan to the magnetic component, the attachment member including:
a top plate that makes contact with an upper surface of the magnetic component;
a pair of legs that extends downward from the top plate and that is fixed to the bottom portion; and
a guiding plate that guides the cool air blown from the inner fan into the magnetic component.

2. The magnetic component cooling structure according to claim 1, wherein the guiding plate includes:
an upper guide plate that extends from the top plate toward the inner fan; and
a side guide plate that extends from the legs toward the inner fan.

3. The magnetic component cooling structure according to claim 2, wherein the side guide plate is disposed only on one side of the magnetic component cooling structure.

4. The magnetic component cooling structure according to claim 1, wherein the attachment member forms a first aperture, which allows the cool air to enter the magnetic component, and a second aperture which allows the cool air to exit the magnetic component.

5. The magnetic component cooling structure according to claim 4, wherein the first and second apertures are disposed on opposite sides of the magnetic component from each other.

6. The magnetic component cooling structure according to claim 1, wherein the bottom portion of the housing on which the magnetic component is fixed is a cooling body.

7. A power converter that comprises the magnetic component cooling structure according to claim 1, wherein the power converter converts AC power into DC power.

8. The magnetic component cooling structure according to claim 1, wherein the attachment member is a metal plate.

9. A magnetic component cooling structure for cooling a magnetic component, the magnetic component cooling structure comprising:
  a housing that the magnetic component is disposed within;
    an inner fan disposed inside the housing to generate cool air that flows in the housing so that a cool air flow space, in which the cool air generated by the inner fan flows in the housing, is formed; and
    an attachment member mounting the magnetic component on a bottom portion of the housing so that the magnetic component is fixed to a position within the cool air flow space such that the cool air is blown from the inner fan to the magnetic component, the attachment member including:
    a top plate that makes contact with an upper surface of the magnetic component;
    a pair of legs that extends downward from the top plate and that is fixed to the bottom portion; and
    heatsinks that protrude outward from the pair of legs and make contact with the cool air generated by the inner fan.

10. The magnetic component cooling structure according to claim 9, wherein the bottom portion of the housing on which the magnetic component is mounted is a cooling body.

11. A power converter comprising the magnetic component cooling structure according to claim 9, wherein the power converter converts AC power into DC power.

12. The magnetic component cooling structure according to claim 9, wherein the attachment member forms a first aperture, which allows the cool air to enter the magnetic component, and a second aperture which allows the cool air to exit the magnetic component.

13. The magnetic component cooling structure according to claim 12, wherein the first and second apertures are disposed on opposite sides of the magnetic component from each other.

14. The magnetic component cooling structure according to claim 9, wherein the heatsinks are disposed on opposite sides of the magnetic component cooling structure.

15. The magnetic component cooling structure according to claim 9, wherein the attachment member is a metal member.

16. An attachment member for fixing a magnetic component that is to be cooled within a housing, the attachment member mounting the magnetic component on the housing so that the magnetic component is fixed to a position within a cool air flow space in which cool air flows, the attachment member including:
  a top plate above an upper surface of the magnetic component; and
  a pair of legs extending downward from the top plate and fixed to the housing.

17. The attachment member according to claim 16, further comprising heatsinks that protrude outward from the pair of legs and make contact with the cool air.

18. The attachment member according to claim 16, further comprising a guiding plate that guides the cool air into the magnetic component.

19. The attachment member according to claim 16, wherein the attachment member is a metal member.

* * * * *